(12) United States Patent
Baumgartl et al.

(10) Patent No.: US 9,030,338 B2
(45) Date of Patent: May 12, 2015

(54) EMI REDUCTION WITH SPECIFIC CODING OF COUNTER SIGNALS

(71) Applicants: Rudi Baumgartl, Erlangen (DE); Nikolaus Demharter, Dormitz (DE); Roland Werner, Langensendelbach (DE)

(72) Inventors: Rudi Baumgartl, Erlangen (DE); Nikolaus Demharter, Dormitz (DE); Roland Werner, Langensendelbach (DE)

(73) Assignee: Siemens Aktiengesellschaft, München (DE)

(*) Notice: Subject to any disclaimer, the term of this patent is extended or adjusted under 35 U.S.C. 154(b) by 12 days.

(21) Appl. No.: 14/044,625

(22) Filed: Oct. 2, 2013

(65) Prior Publication Data

US 2014/0028481 A1    Jan. 30, 2014

Related U.S. Application Data

(62) Division of application No. 13/077,285, filed on Mar. 31, 2011, now Pat. No. 8,570,195.

(51) Int. Cl.
| | | |
|---|---|---|
| *H03M 7/04* | (2006.01) | |
| *H03M 7/16* | (2006.01) | |
| *G01R 33/36* | (2006.01) | |
| *H03M 5/04* | (2006.01) | |

(52) U.S. Cl.
CPC ............... *H03M 7/16* (2013.01); *G01R 33/36* (2013.01); *H03M 5/04* (2013.01); *H03M 7/04* (2013.01)

(58) Field of Classification Search
CPC ............ H03M 5/04; H03M 7/04; H03M 7/16
USPC .............................................. 341/97, 98
See application file for complete search history.

(56) References Cited

U.S. PATENT DOCUMENTS

| | | | | |
|---|---|---|---|---|
| 3,675,236 | A * | 7/1972 | Shoap | 341/97 |
| 4,055,841 | A * | 10/1977 | Crawford | 341/97 |
| 4,125,832 | A | 11/1978 | Shinoda et al. | |
| 4,618,849 | A | 10/1986 | Bruestle | |
| 5,045,854 | A | 9/1991 | Windmiller | |
| 5,084,841 | A | 1/1992 | Williams et al. | |
| 5,428,654 | A | 6/1995 | Baqai | |
| 5,754,614 | A | 5/1998 | Wingen | |
| 6,801,143 | B2 * | 10/2004 | Oberai et al. | 341/98 |
| 6,809,666 | B1 * | 10/2004 | Ewedemi et al. | 341/97 |
| 6,836,525 | B1 * | 12/2004 | Weng | 377/34 |
| 6,907,098 | B2 | 6/2005 | Nakamura | |
| 6,937,172 | B1 * | 8/2005 | Lowe et al. | 341/97 |
| 6,950,138 | B2 | 9/2005 | Hamaguchi | |
| 7,019,673 | B2 * | 3/2006 | Blaum et al. | 341/98 |

(Continued)

FOREIGN PATENT DOCUMENTS

DE    103 14 215 B4    11/2006

OTHER PUBLICATIONS

German Office Action dated Dec. 17, 2010 for corresponding German Patent Application No. DE 10 2010 013 683.2-54 with English translation.

*Primary Examiner* — Linh Nguyen
(74) *Attorney, Agent, or Firm* — Lempia Summerfield Katz LLC

(57) ABSTRACT

Apparatuses and a method for transmitting a counter signal in an imaging system are provided. Counter states of the counter signal are Gray coded to Gray coded counter states before transmission. Every second Gray coded counter state is inverted to an inverted counter state. The Gray coded counter states inverted in every second counter state are transmitted and are decoded on receipt.

12 Claims, 5 Drawing Sheets

(56) References Cited

U.S. PATENT DOCUMENTS

| | | | |
|---|---|---|---|
| 7,702,061 B2 * | 4/2010 | Shao et al. | 377/47 |
| 7,916,048 B2 | 3/2011 | Basappa et al. | |
| 7,991,104 B1 * | 8/2011 | Dahan | 377/34 |
| 8,097,491 B1 | 1/2012 | Hsu et al. | |
| 2003/0067401 A1 | 4/2003 | Yi | |
| 2004/0017303 A1 | 1/2004 | Loewen | |
| 2005/0258988 A1 * | 11/2005 | Jiang | 341/97 |
| 2007/0296621 A1 | 12/2007 | Yoshizawa | |

* cited by examiner 312,5 kHz  625 kHz  1,25 MHz  2,5 MHz  5 MHz  10 MHz

EMI REDUCTION WITH SPECIFIC CODING OF COUNTER SIGNALS

This application is a divisional application of U.S. patent application Ser. No. 13/077,285, filed on Mar. 31, 2011, which claims the benefit of DE 10 2010 013 683.2, filed on Apr. 1, 2010.

BACKGROUND

The present embodiments relate to a method and apparatus for transmitting a counter signal in an imaging system.

Magnetic resonance devices for examining objects or patients using magnetic resonance tomography are known, for example, from DE10314215B4.

Modem magnetic resonance systems (MRT) operate with coils for transmitting high-frequency pulses for nuclear resonance excitation and/or for receiving induced magnetic resonance signals. A magnetic resonance system may include a permanent magnet or, more frequently, a superconducting coil for generating a substantially homogeneous basic magnetic field (H0) in an examination region, a large whole body coil (e.g., a body coil or BC) that may be integrated in a permanent manner in the MR device and a plurality of small local coils (e.g., surface coils or LC). To read out information, from which images of a patient may be generated, gradient coils for three axes (e.g., X and Y roughly radial to the patient and Z in the longitudinal direction of the patient) are used to read out selected regions of the object or patient to be examined. Local coding in magnetic resonance tomography may be implemented with the aid of a gradient coil arrangement with three independently activatable, magnetically orthogonal gradient field coil systems. By overlaying the three freely scalable fields (e.g., in three directions X, Y, Z), the orientation of the coding plane ('gradient field') may be selected freely.

Counter signals are transmitted between or in components of the MRT.

An EMC spectrum of a binary counter is determined by a dwell time of individual counter bits.

In the case of a counter with a clock rate of 10 MHz, bit[0] has a switching frequency of 5 MHz, bit[1] a switching frequency of 2.5 MHz, etc. The following applies: $f_{Bit}=f_{count}/2^N$, where N is the bit position in the counter. Spectral frequencies result, as shown in FIG. 1.

In MR systems, spectral lines with frequencies that are not multiples of 2.5 MHz cause interference due to mixing effects. The prior art attempts to eliminate the problem by adequate shielding measures (e.g., housing, filter, shielded lines).

SUMMARY AND DESCRIPTION

The present embodiments may obviate one or more of the drawbacks or limitations in the related art. For example, counters of an imaging system may be optimized.

Low-frequency (e.g., <2.5 MHz) spectral lines result because individual counter bits retain the same value for longer than 2 clock periods. A counter code, with which none of the bits retain a value for more than two clock pulses with successive numbers, was proposed. An arrangement of the present embodiments may recode a counter binary code such that this condition is met. A binary coded signal of a counter may be converted first to a Gray code, every second Gray word may be inverted, and the Gray coded words (e.g., also inverted in every second word) are transmitted.

DETAILED DESCRIPTION OF THE DRAWINGS

Figure 9:
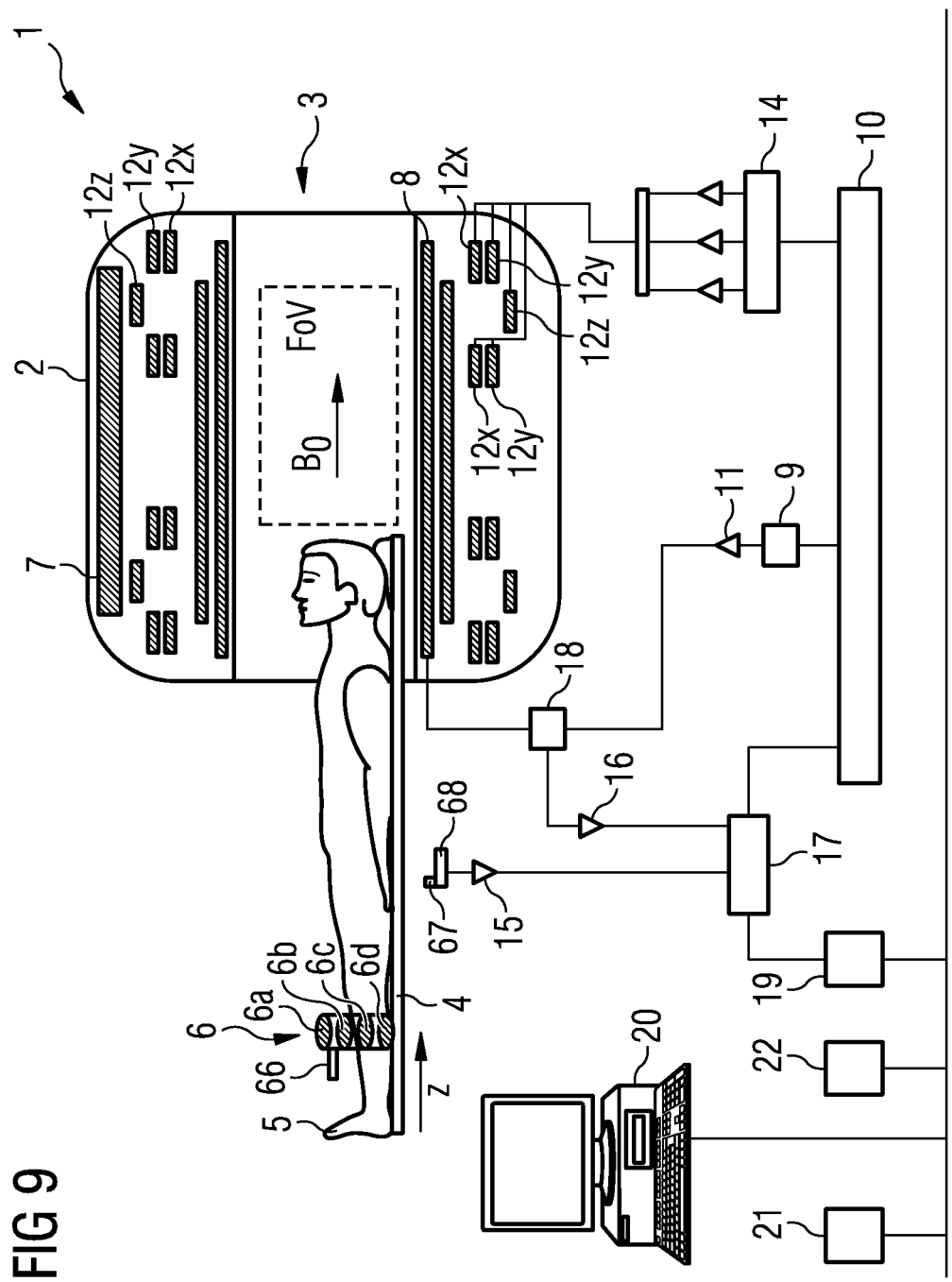
FIG. 9 shows a schematic diagram of an MRT system.

FIG. 9 shows a magnetic resonance imaging device MRT 1 having a whole body coil 2 with a tubular chamber 3, into which a patient couch 4 holding a body 5 (e.g., of a patient (with or without a local coil arrangement 6)) may be moved in the direction of the arrow z, to generate recordings of the patient 5. The local coil arrangement 6 is positioned on the patient 5, allowing good recordings in a local region (e.g., field of view). Signals from the local coil arrangement 6 may be evaluated (e.g. converted to images and stored or displayed) by an evaluation system (e.g., elements, 67, 66, 15, 17) of the MRT 1 that may be connected by coaxial cable or radio, for example, to the local coil arrangement 6.

In order to use a magnetic resonance device MRT 1 to examine the body 5 (e.g., an examination object or the patient) using magnetic resonance imaging, different magnetic fields that are matched to one another with respect to temporal and spatial characteristics are radiated onto the body 5. In one embodiment, a powerful magnet (e.g., a cryomagnet 7) in a measurement cabin with a tunnel-shaped opening 3, generates a powerful static main magnetic field $B_0$ of, for example, 0.2 Tesla to 3 Tesla or more. The body 5 to be examined is supported on the patient couch 4 and moved into a roughly homogeneous region of the main magnetic field B0 in the field of view (FoV). Excitation of the nuclear spin of atomic nuclei of the body 5 takes place by way of magnetic high-frequency excitation pulses, which are radiated in by way of a high-frequency antenna (and/or optionally, a local coil arrangement) shown in a simplified manner in FIG. 9 as a body coil 8. High-frequency excitation pulses are generated, for example, by a pulse generation unit 9, which is controlled by a pulse sequence control unit 10. After amplification by a high-frequency amplifier 11, the high-frequency excitation pulses are routed to the high-frequency antenna 8. The high-frequency system shown in FIG. 9 is illustrated schematically. In other embodiments, more than one pulse generation unit 9, more than one high-frequency amplifier 11 and a plurality of high-frequency antennas 8 are deployed in the magnetic resonance device 1.

The magnetic resonance device 1 also includes gradient coils 12x, 12y, 12z, which are used during a measurement to radiate magnetic gradient fields for selective layer excitation and local coding of the measurement signal. The gradient coils 12x, 12y, 12z are controlled by a gradient coil control unit 14 that is connected to the pulse sequence control unit 10.

The signals emitted by the excited nuclear spin are received by the body coil 8 and/or at least one local coil arrangement 6, amplified by assigned high-frequency preamplifiers 16 and further processed and digitized by a receive unit 17. Recorded measurement data is digitized and stored as complex numerical values in a k-space matrix. An associated MR image may be reconstructed from the k-space matrix populated with values using a multidimensional Fourier transformation.

For a coil that may be operated in both transmit and receive mode such as the body coil 8, for example, correct signal forwarding is regulated by an upstream transmit/receive switch 18.

An image processing unit 19 generates an image from the measurement data, the image being displayed to a user by way of an operating console 20 and/or stored in a storage unit 21. A central computer unit 22 controls the individual system components.

In MR tomography, images with a high signal to noise ratio (SNR) may be recorded using local coil arrangements (e.g., coils, local coils). The local coil arrangements are antenna systems that are positioned in direct proximity on (anterior), below (posterior) or in the body. During an MR measurement, the excited nuclei induce a voltage in the individual antennas of the local coil, the voltage being amplified with a low-noise preamplifier (e.g., LNA, preamp) and forwarded to the electronic receive system. To improve the signal to noise ratio (even with high-resolution images), high-field systems (e.g., 1.5 T and more) are deployed. Since more individual antennas may be connected to the MR receive system than there are receivers present, a switching matrix (e.g., RCCS) is installed between the receive antennas and the receivers. This routes the active receive channels (e.g., those in the field of view of the magnet) to the receivers present. This allows more coil elements to be connected than there are receivers present, since with whole body coverage, those coils that are in the FoV (field of view) or in the homogeneity volume of the magnet are read out.

The local coil arrangement 6 may be an antenna system that includes, for example, one coil or an array coil of a plurality of antenna elements 6a, 6b, 6c, 6d (e.g., coil elements). The individual antenna elements include, for example, loop antennas (loops), butterfly coils or saddle coils. The local coil arrangement may include, for example, coil elements, a preamplifier, further electronic components (e.g., sheath wave traps), a housing, bearings and a cable with a plug, by which the local coil arrangement is connected to the MRT system. A receiver 68 on the system side filters and digitizes a signal received from the local coil 6 (e.g., by radio) and forwards the data to a digital signal processor that may derive an image or spectrum from the data obtained by the measurement and supplies the image or spectrum to the user (e.g., for subsequent diagnosis or storage).

The present embodiments include a coding and decoding of a counter signal and apparatuses for this purpose. A counter signal is transmitted between two components of the magnetic resonance tomography device 1.

Figure 1:
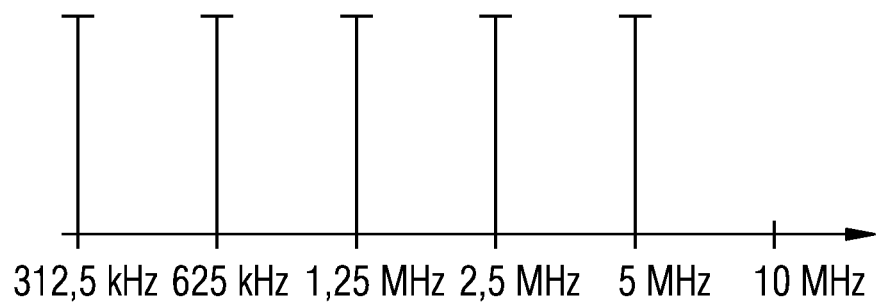
FIG. 1 shows spectral frequencies of a signal to be transmitted that has been generated by a binary coded binary counter.

FIG. 1 shows spectral frequencies of a signal generated by a binary counter and transmitted. Some of the spectral frequencies may cause interference. The interference may be avoided according to the present embodiments. For this, according to the present embodiments, counter states of the counter signal that are to be transmitted temporally one after another are recoded to avoid certain potential interference frequencies (e.g., Gray coding of binary code to Gray code and inversion), transmitted and decoded (inversion and Gray decoding from Gray code to a binary code decoding).

Figure 2:
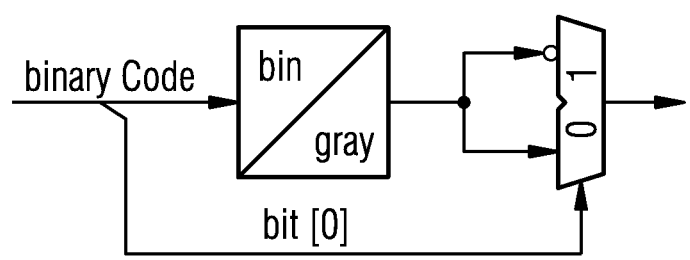
FIG. 2 shows a schematic diagram of a Gray code coding of a counter signal and an inversion of every second Gray code word.

FIG. 2 shows a schematic diagram of the recoding of a counter signal "binary code" (e.g., 8-bit) originating from a counter using a binary code/Gray code converter "bin/gray" to a Gray code and an inversion of every second Gray code word of the Gray code signal to form an (in every second word) inverted signal.

Figure 3:
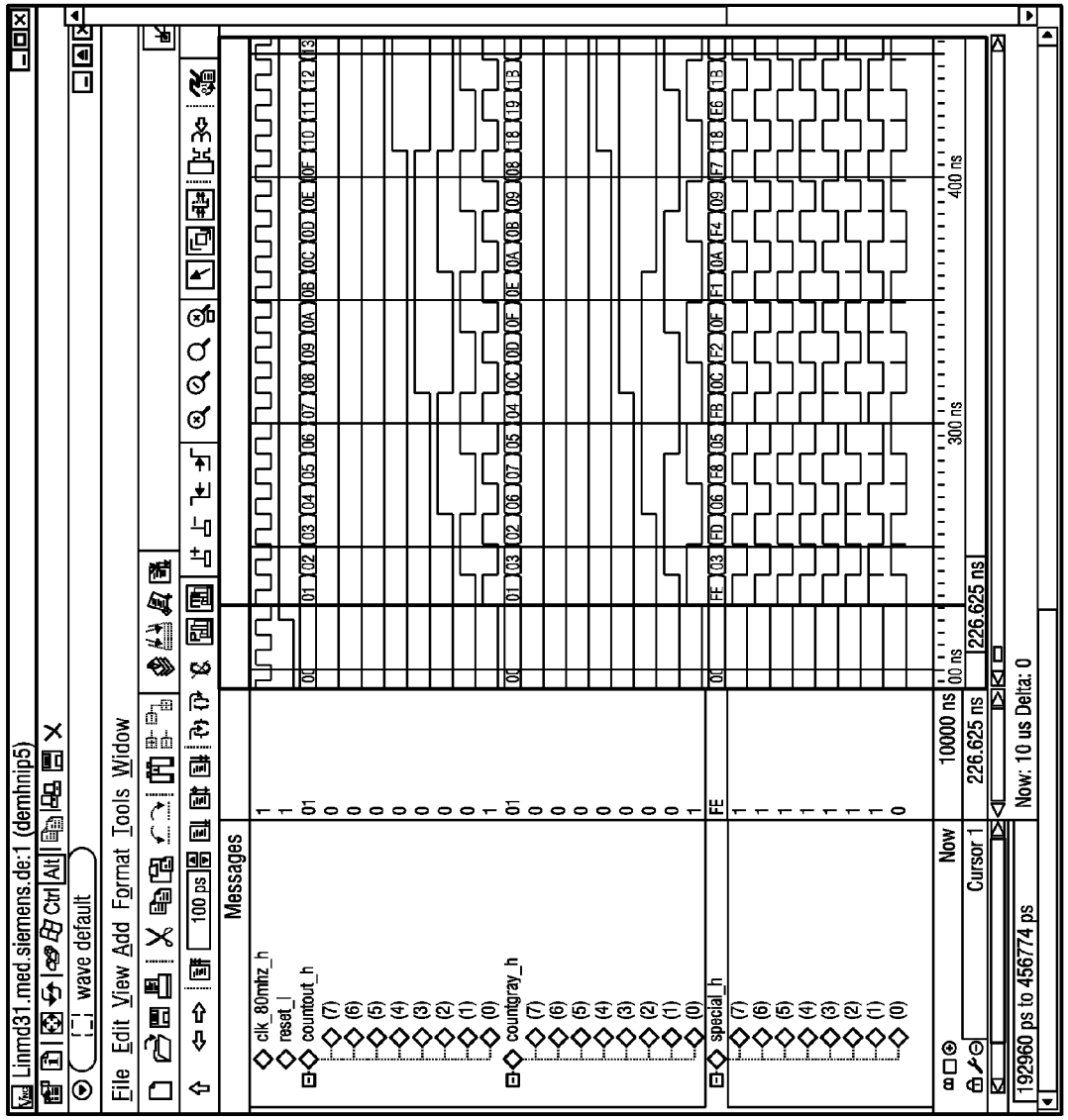
FIG. 3 shows a temporal signal profile for the recoding of a signal to a Gray code signal and an inversion of every second Gray code signal word.

FIG. 3 shows a temporal signal profile for an inversion of a counter signal ("countout_h") (e.g., 8-bit) originating from a counter to a Gray coded signal ("countgray_h") using a binary code/Gray code converter and a recoding of every second Gray coded counter state ("countgray_h") of the counter signal to an (e.g., in every second word=counter state) inverted signal ("special_h").

The successive 8-bit counter states ("01", "02", "03" . . . "1B") of the counter signal ("countout_h") are Gray coded ("bin/gray") to Gray code coded counter states ("01", "03", "02" . . . "1B") in the 8-bit Gray code signal "count-gray_h", and every second counter state ("01", "02". . .) of the 8-bit Gray code signal "count-gray_h" is inverted ("0 1") to a respectively inverted counter state ("FE", "FD". . . ) of the counter signal ("special_h") to be transmitted.

Gray coded, inverted and non-inverted, temporally successive counter states ("00", "FE", "03", "FD", "06" . . . "1B") of the recoded counter signal ("special_h") to be transmitted are transmitted temporally one after another digitally from one component of the MRT 1 to another component of the MRT 1 or within the one component of the MRI 1.

FIG. 3 also shows bit patterns of an output signal of a binary counter. States of the counter bits get longer from left to right. FIG. 3 also shows how the binary signal is first recoded to Gray code. This also features increasingly long states of the counter bits. The completed output signal (special) may be identified. Bits in the completed output signal are a maximum of 2 clock pulses long. A word at counter state zero may be transmitted as a first word or not at all.

Decoding:

By way of example, the following three variants may be used for decoding the counter signal ("special_h") after transmission of the counter signal in or to a component of the MRT 1 and receipt by the component.

To decode a received counter signal ("special_h") according to the embodiments shown in FIGS. 4-7, each of the counter states ("FE", "03", "FD" . . . "F1") of the received counter signal ("special_h") are received temporally one after another digitally, every second received counter state ("FE", "FD" . . . "F1" to "special_h") being inverted to an (back re-) inverted counter state ("01", "02" . . . "0E" to "countgray_h"). The counter states between two counter states to be inverted are not inverted, and conversion ("gray/bin") takes place for the Gray coded counter states ("01", "03", "02" . . . "0E" to "countgray_h") (i.e., the re-inverted and non-re-inverted) to binary code coded counter states ("01", "02", "03" . . . "0B" to "countout_h").

A resulting clock signal "countout_h" at the receiver after the Gray coding and partial inversion, transmission, partial re-inversion and Gray decoding is the clock signal "countout_h" originally supplied by the counter.

Figure 4:
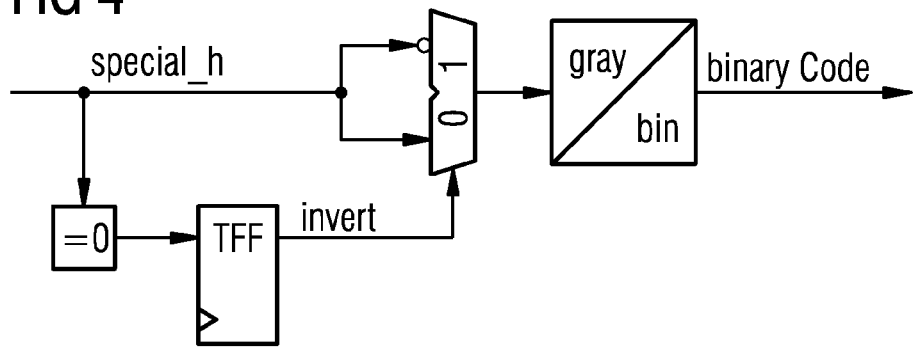
FIG. 4 shows one embodiment of a circuit for decoding a received signal.

FIG. 4 shows the decoding of a transmitted, received signal, where a similarly transmitted zero value in the counter signal ("originalbinaryCount[0]") is used after decoding the transmitted, received signal (e.g., to a value "F") to activate the inverter ("0 1") by way of a toggle flip-flop ("TFF") for every second received counter state ("FE", "FD" . . . "F1" to "special_h") to invert the counter state.

Figure 5:
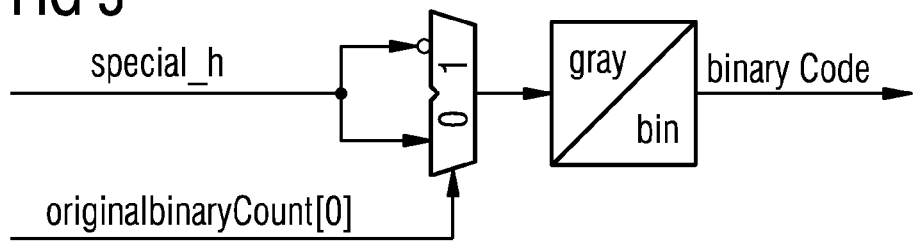
FIG. 5 shows another embodiment of a circuit for decoding a received signal.

Alternatively, according to FIG. 5, synchronization may be performed by transmitting the bit [0] from the original binary counter ("originalbinarycount[0]" in FIG. 5"). Since the bit [0] was used to invert each of the Gray code words to be transmitted (i.e., in every second), this signal may also be used for the back transformation to Gray code when the signal is transmitted at the same time. FIG. 5 shows the decoding of a transmitted, received signal with an inversion of every second received counter state, with the lowest value bit (FIG. 5, bit "0") from a similarly received counter signal ("orignalbinaryCount[0]") being used to activate the inverter ("0 1") to invert every second received counter state ("FE", "FD" . . . "F1" to "special_h").

Figure 6:
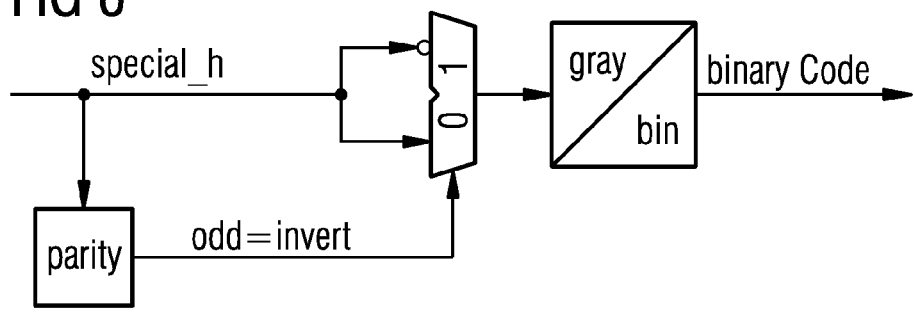
FIG. 6 shows yet another embodiment of a circuit for decoding a received signal.

Alternatively, according to FIG. 6, synchronization may be performed by calculating parity.

FIG. 6 shows the decoding of a transmitted, received signal with an inversion of every second received counter state, with the parity of each of the received counter states being determined (FIG. 6, "parity") and used to activate the inverter ("0 1") in a parity-dependent manner to invert every second received counter state.

Figure 7:
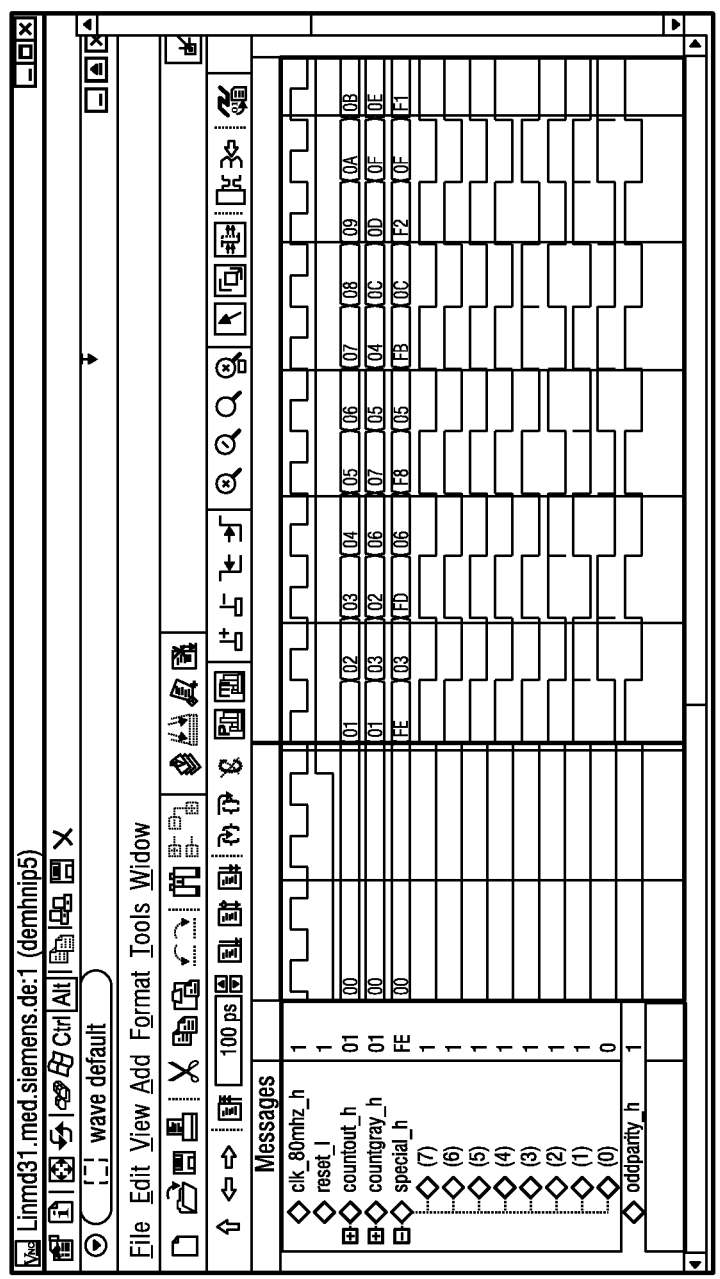
FIG. 7 shows a temporal signal profile for the decoding of a received counter signal with an inversion of every second word.

FIG. 7 shows how the parity of the signal "speciaLh" changes with each clock pulse. This allows the back transformation to Gray code based on the parity of the received code word. The parity is a function of the width of the counter.

With an even width of the signal (e.g., 8 bits as in FIG. 4) the presence of an odd parity indicates that the input word is to be inverted to get back to the original Gray code. With an odd width of the signal (e.g., 7 bits), the presence of an even parity indicates that the input word is to be inverted to get back to the original Gray code. Transmission of the parity signal parallel to the signal "special_h" also allows the counter signal to be checked for errors, since the parity signal also changes quickly enough and meets the requirement (e.g., not longer than 2 clock pulses in the same state). Additional back transformation possibilities may be used.

FIG. 7 shows a temporal signal profile for the inversion of a received (e.g., 8-bit) counter signal ("special_h") to an inverted signal ("countgray_h"), and a recoding of an inverted signal ("countgray_h") using a binary code/Gray code converter to a binary coded counter signal ("countout_h"). The recoding of the inverted signals is in every second word (i.e., only in every second counter state).

Figure 8:
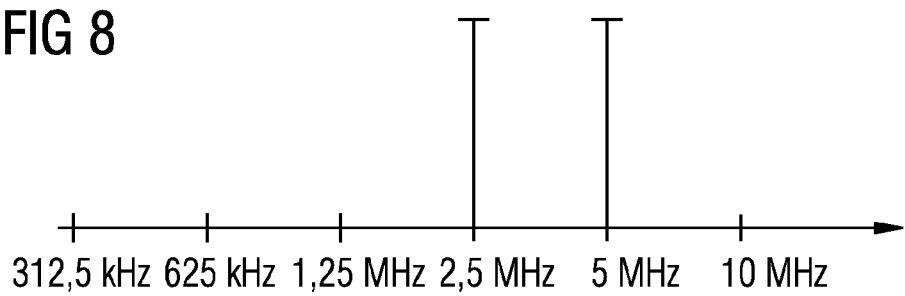
FIG. 8 shows potentially emitted spectral frequencies of a transmitted binary counter signal.

FIG. 8 shows potentially emitted spectral frequencies of a binary counter signal transmitted with coding of the present embodiments.

The spectrum of the counter (with optional additional signals) features the illustrated spectrum. Spectral lines for frequencies lower than 2.5 MHz have been removed.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for decoding a counter signal received after a transmission in an imaging system, the method comprising;
   receiving counter states of the received counter signal;
   inverting every second received counter state to a Gray coded counter state; and
   converting the Gray coded counter states to binary code coded counter states.

2. The method for decoding as claimed in claim 1, wherein inverting every second received counter state comprises using a lowest value bit from the received counter signal to activate an inverter for the received counter states to invert the received counter states.

3. The method for decoding as claimed in claim 2, wherein the lowest value bit from the received counter signal is used to activate the inverter by way of a toggle flip-flop for every second received counter state to invert the received counter states.

4. The method for decoding as claimed in claim 2, wherein a lowest value bit from another received counter signal is used to activate the inverter to invert every second received counter state.

5. The method for decoding as claimed in claim 1, wherein inverting every second received counter state comprises determining and using parities of the received counter states activate an inverter in a parity-dependent manner.

6. The method for decoding as claimed in claim 5, wherein every second counter state is inverted starting with a first received counter state or starting with a second received counter state.

7. The method for decoding as claimed in claim 1, wherein the imaging system is a magnetic resonance tomography system.

8. An apparatus for decoding a received counter signal transmitted in an imaging system, the apparatus comprising:
   an inversion device configured to invert every second received counter state of the counter signal;
   a Gray decoding device configured to Gray decode all the received counter states to binary coded counter states.

9. The apparatus as claimed in claim 8, wherein the apparatus is configured so that a lowest value bit from the received counter signal is used to activate the inversion device for every second received counter state to invert the received counter state.

10. The apparatus as claimed in claim 9, wherein the apparatus is configured so that the lowest value bit from the received counter signal is used to activate the inversion device by way of a toggle flip-flop for every second received counter state to invert the counter state.

11. The apparatus as claimed in claim 9, wherein the apparatus is configured so that the lowest value bit of another received counter signal is used to activate the inversion device to invert every second received counter state.

12. The apparatus as claimed in claim 8, wherein the apparatus is configured so that parities of the received counter states are determined and used to activate the inversion device in a parity-dependent manner to invert every second received counter state.

* * * * *